(12) United States Patent
Bullock et al.

(10) Patent No.: US 11,667,175 B2
(45) Date of Patent: Jun. 6, 2023

(54) INTERIOR PANEL INCLUDING CAPACITIVE CHANGE DETECTION FOR AN INTERIOR OF A VEHICLE AND A METHOD FOR MAKING THE SAME

(71) Applicant: Gulfstream Aerospace Corporation, Savannah, GA (US)

(72) Inventors: John Bullock, Savannah, GA (US); Sean Thornton, Savannah, GA (US); John Marchetti, Savannah, GA (US); Josh Tatum, Savannah, GA (US); Stephen Spencer, Savannah, GA (US)

(73) Assignee: Gulfstream Aerospace Corporation, Savannah, GA (US)

( * ) Notice: Subject to any disclaimer, the term of this patent is extended or adjusted under 35 U.S.C. 154(b) by 808 days.

(21) Appl. No.: 16/568,051

(22) Filed: Sep. 11, 2019

(65) Prior Publication Data
US 2021/0070153 A1    Mar. 11, 2021

(51) Int. Cl.
*B60J 5/04*    (2006.01)
*G06F 3/044*    (2006.01)
(Continued)

(52) U.S. Cl.
CPC .......... *B60J 5/0416* (2013.01); *G06F 3/044* (2013.01); *H01H 9/182* (2013.01);
(Continued)

(58) Field of Classification Search
CPC .......... H01H 2231/026; H01H 9/182; H01H 2217/032; H01H 2219/018; H01H 2219/022; H01H 2219/024; H01H 2219/036; H01H 2219/054; H01H 2221/00; H01H 2221/008; H01H 2221/07; H01H 2223/038; H01H 2225/01; H01H 2231/00; H01H 2239/064; H01H 2239/074; H01H 2003/00; H01H 2003/12; H01H 2009/0285; H01H 2009/16; H01H 2009/18; H01H 2009/182; H01H 2009/184; H01H 2009/186; H01H 2009/187;
(Continued)

(56) References Cited

U.S. PATENT DOCUMENTS

| | | | | |
|---|---|---|---|---|
| 2002/0112942 A1* | 8/2002 | Galmiche | ............ | H03K 17/962 200/600 |
| 2009/0065336 A1* | 3/2009 | Bayley | ............ | H01H 13/83 200/313 |
| 2014/0132528 A1* | 5/2014 | Catton | ............ | G06F 3/03547 345/173 |

* cited by examiner

*Primary Examiner* — Anthony R Jimenez
(74) *Attorney, Agent, or Firm* — LKGlobal | Lorenz & Kopf, LLP

(57) ABSTRACT

Interior panels for interiors of vehicles, vehicles, and methods for making interior panels for interiors of vehicles are provided. In one example, the interior panel includes an outer covering having a first surface. A second surface is disposed opposite the first surface. The second surface has a pattern formed therein that is hidden from the first surface. A light source is operative to generate light and is disposed adjacent to the second surface generally aligned with the pattern. When the light source generates light, an illuminated pattern corresponding to the pattern is visible on the first surface. A capacitive sensor is configured to generate a capacitance change signal in response to change in capacitance of the capacitive sensor. A controller is in communication with the capacitive sensor to receive the capacitance change signal and is configured to generate a command signal in response to the capacitance change signal.

17 Claims, 6 Drawing Sheets

(51) Int. Cl.
*H03K 17/96* (2006.01)
*H01H 9/18* (2006.01)

(52) U.S. Cl.
CPC .... *H03K 17/962* (2013.01); *B60K 2370/1434* (2019.05); *H01H 2231/026* (2013.01)

(58) Field of Classification Search
CPC ......... H01H 2209/00; H01H 2209/002; H01H 2209/016; H01H 2209/014; H01H 2209/018; H01H 2209/02; H01H 2209/038; H01H 2209/04; H01H 2209/068; H01H 2209/082; H01H 2209/084; H01H 2219/028; H01H 2219/006; H01H 2219/039; H01H 13/00; H01H 13/70; H01H 13/702; H01H 13/703; H01H 13/704; H01H 13/705; B60K 2370/1434; B60K 2350/00; B60K 2350/1024; B60K 2350/2043; B60K 7/00; B60K 7/06; H03K 17/962; H03K 2217/96015; H03K 2217/96042; H03K 17/9625; G06F 3/044; B60J 5/0416; B60Q 2500/10; B60Q 3/54; B60R 2013/0281; B60R 2013/0287; B60R 13/02; H01C 10/12
USPC ...................................... 296/187.01; 200/511
See application file for complete search history.

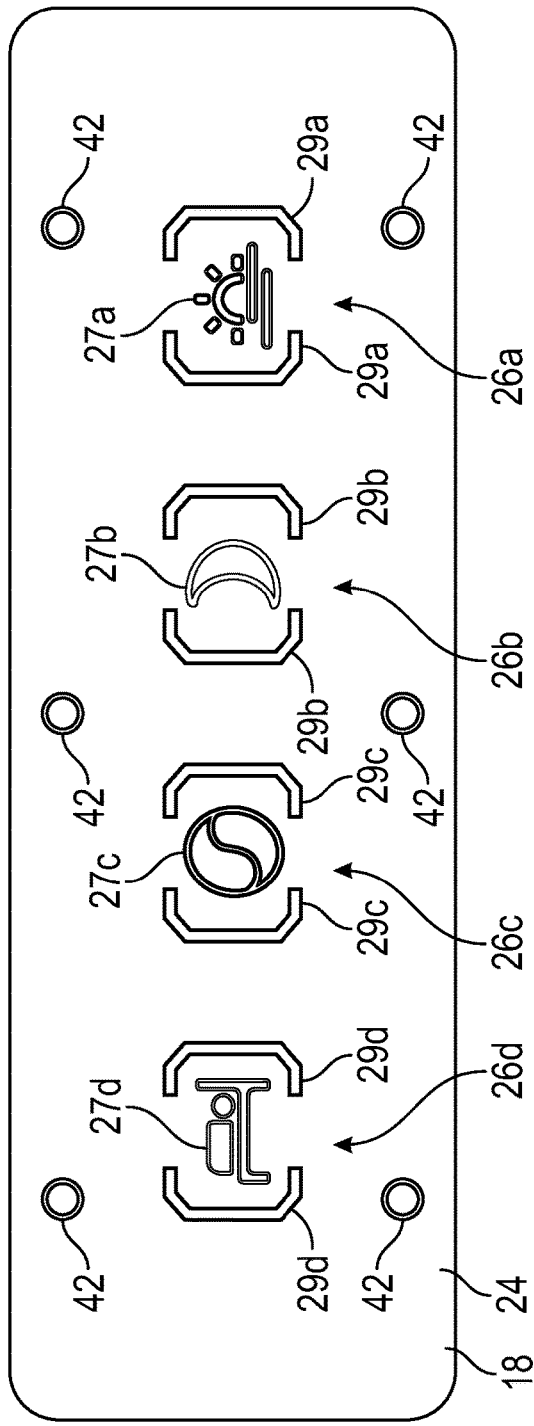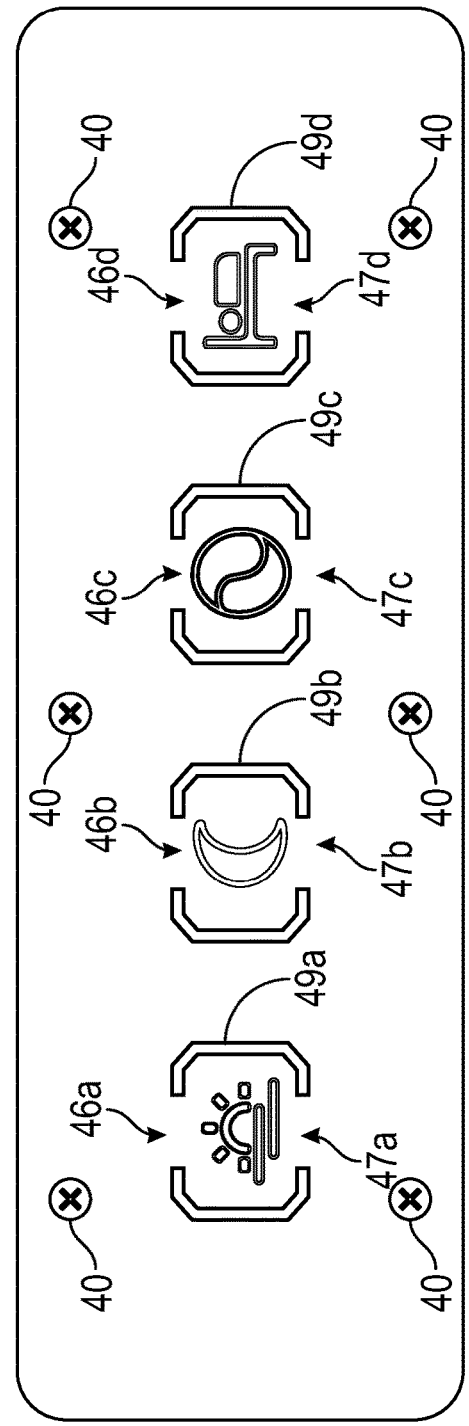

INTERIOR PANEL INCLUDING CAPACITIVE CHANGE DETECTION FOR AN INTERIOR OF A VEHICLE AND A METHOD FOR MAKING THE SAME

TECHNICAL FIELD

The technical field relates generally to interior panels for a vehicle, and more particularly, relates to interior panels integrated with hidden illuminable capacitive detection controls for an interior of a vehicle, vehicles including such interior panels, and methods for making such interior panels.

BACKGROUND

Many vehicles, for example, such as aircraft or the like have interiors that include one or more areas such as a cabin area, lavatory area, galley area, and/or the like for passengers and/or other occupants. These interior areas may include and/or be separated by interior panels that may form part of a bulkhead, decorative surface, and/or the like.

While aboard, for example, the aircraft and especially during taxi, take-off, flight, and landing, it is desirable to provide the passengers and/or other occupants of the aircraft with a comfortable and enjoyable travel experience. This can be accomplished, for example, by providing the passengers and/or other occupants of the aircraft with the ability to conveniently control ambient environment/conditions, order food services or flight attendant assistance, and/or the like.

Many aircraft have push-able buttons that are positioned on interior panels in the interior area(s) (e.g., cabin area or the like) of the aircraft. These buttons often include symbols, words, and/or lettering associated with communicating information, controlling ambient conditions, and/or notifying staff or crew. However, these buttons are constantly visible to the passengers and/or other occupants and can be unsightly and visually disruptive of an otherwise aesthetically pleasing surface. For example, an interior panel that includes an aesthetically pleasing wood-grain surface to which a push actuatable food service button is constantly displayed disrupts the otherwise continuous aesthetically pleasing, woodgrain appearance of the interior panel's surface and is unsightly.

Accordingly, it is desirable to provide an interior panel for an interior of a vehicle that addresses one or more of the foregoing issues, a vehicle including such interior panels, and methods for making such interior panels. Furthermore, other desirable features and characteristics of the various embodiments described herein will become apparent from the subsequent detailed description and the appended claims, taken in conjunction with the accompanying drawings and this background.

SUMMARY

Various non-limiting embodiments of an interior panel for an interior of a vehicle, a vehicle, and a method for making an interior panel for an interior of a vehicle are provided herein.

In a first non-limiting embodiment, the interior panel includes, but is not limited to, an outer covering that has a first surface. The first surface is configured to be exposed to the interior of the vehicle. A second surface is disposed opposite the first surface. The second surface has a first pattern formed therein that is hidden from the first surface. The interior panel further includes, but is not limited to, a first light source that is operative to generate light. The first light source is disposed adjacent to the second surface generally aligned with the first pattern. When the first light source generates light, a first illuminated pattern corresponding to the first pattern formed in the second surface is visible on a first area of the first surface. The interior panel further includes, but is not limited to, a first capacitive sensor that is disposed proximate to the second surface. The first capacitive sensor is configured to generate a first capacitance change signal in response to change in capacitance of the first capacitive sensor when an object is proximate to the first area of the first surface. The interior panel further includes, but is not limited to, a controller that is in communication with the first capacitive sensor to receive the first capacitance change signal. The controller is configured to generate a first command signal in response to the first capacitance change signal.

In another non-limiting embodiment, the vehicle includes, but is not limited to, a vehicle structure that has an interior. The vehicle further includes, but is not limited to, an interior panel that is disposed in the interior of the vehicle structure. The interior panel includes an outer covering that has a first surface that is exposed to the interior of the vehicle structure. A second surface is disposed opposite the first surface. The second surface has a pattern formed therein that is hidden from the first surface. The interior panel further includes a light source that is operative to generate light. The light source is disposed adjacent to the second surface generally aligned with the pattern. When the light source generates light, an illuminated pattern corresponding to the pattern formed in the second surface is visible on an area of the first surface. The interior panel further includes a capacitive sensor that is disposed proximate to the second surface. The capacitive sensor is configured to generate a capacitance change signal in response to change in capacitance of the capacitive sensor when an object is proximate to the area of the first surface. The interior panel further includes a controller that is in communication with the capacitive sensor to receive the capacitance change signal. The controller is configured to generate a command signal in response to the capacitance change signal.

In another non-limiting embodiment, the method includes, but is not limited to, obtaining an outer covering that has a first surface. The first surface is configured to be exposed to the interior of the vehicle. A second surface is disposed opposite the first surface. The method further includes, but is not limited to, forming a pattern in the second surface that is hidden from the first surface. The method further includes, but is not limited to, disposing a light source adjacent to the second surface generally aligned with the first pattern. The light source is operative to generate light. When the light source generates light, an illuminated pattern corresponding to the pattern formed in the second surface is visible on an area of the first surface. The method further includes, but is not limited to, disposing a capacitive sensor proximate to the second surface. The capacitive sensor is configured to generate a capacitance change signal in response to change in capacitance of the capacitive sensor when an object is proximate to the area of the first surface. The method further includes, but is not limited to, arranging a controller in communication with the capacitive sensor to receive the capacitance change signal. The controller is configured to generate a command signal in response to the capacitance change signal.

BRIEF DESCRIPTION OF THE DRAWINGS

The various embodiments will hereinafter be described in conjunction with the following drawing figures, wherein like numerals denote like elements, and wherein:

FIG. 3 illustrates a back view of an outer covering of an interior panel that includes patterns in accordance with an exemplary embodiment;

FIG. 4 illustrates a top view of a board assembly that includes patterns in accordance with an exemplary embodiment;

DETAILED DESCRIPTION

Figure 1:
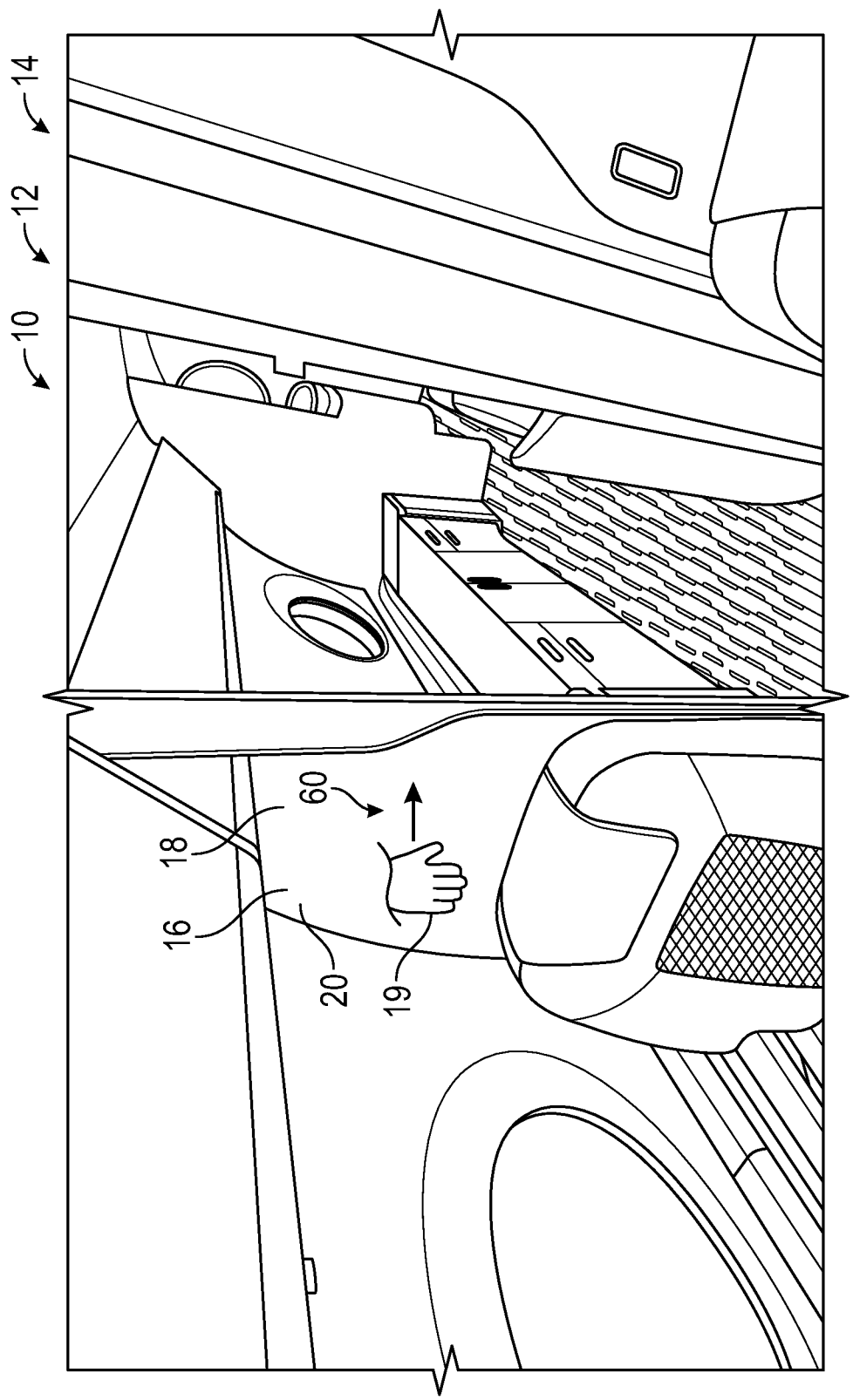
FIG. 1 illustrates a perspective view of a portion of an aircraft interior including an interior panel in accordance with an exemplary embodiment.

The following Detailed Description is merely exemplary in nature and is not intended to limit the various embodiments or the application and uses thereof. Furthermore, there is no intention to be bound by any theory presented in the preceding background or the following detailed description.

Various embodiments contemplated herein relate to interior panels for interiors of vehicles, vehicles including interior panels, and methods for making interior panels for interiors of vehicles. The exemplary embodiments taught herein provide a vehicle having a vehicle structure. The vehicle structure has an interior with an interior panel disposed therein. The interior panel includes an outer covering having a first surface that is exposed to the interior of the vehicle structure and a second surface that is disposed opposite the first surface.

In an exemplary embodiment, the first surface of the outer covering is a relatively smooth, aesthetically pleasing continuous surface. The second surface has a pattern formed therein that is hidden from the first surface. A light source is operative to selectively generate light and is disposed adjacent to the second surface generally aligned with the pattern. When the light source generates the light, an illuminated pattern corresponding to the pattern formed in the second surface is visibly produced on a first area of the first surface. Without being limited by theory, in an exemplary embodiment, the outer covering including the pattern allows a first portion of the light that is substantially aligned with the pattern features formed in the second surface to pass therethrough while substantially obstructing a second portion of the light that would otherwise illuminate outside of the borders of the pattern features to make the pattern features on the second surface visibly read through to the first surface as the illuminated pattern.

In an exemplary embodiment, the interior panel includes a capacitive sensor that is disposed proximate to the second surface and that is configured to generate a capacitance change signal in response to change in capacitance of the capacitive sensor when an object is proximate to the first area of the first surface. The object is, for example, a finger or other portion(s) of a hand, a glove or mitten with conductive threads, or the like.

In an exemplary embodiment, the interior panel includes a controller that is in communication with the capacitive sensor to receive the capacitance change signal and that is configured to generate a command signal in response to the first capacitance change signal. The command signal is, for example, directed to a control system that directly or indirectly performs a command. The command is, for example, adjusting ambient lighting, adjusting ambient conditions, calling a flight attendant, or the like. In an exemplary embodiment, the controller is in communication with the light source to direct the light source to generate light in response to the capacitance change signal.

In an exemplary embodiment, advantageously forming the pattern (e.g., as a symbol) by embedding/etching/defining the pattern in the second surface such that the pattern is not visible through the first surface until the pattern is illuminated and selectively generating light to produce the illuminated pattern (e.g., as an illuminated symbol) that corresponds to the pattern visible on the first surface via a change in the capacitance of the capacitive sensor by, for example, a finger allows for an aesthetically pleasing interior panel that is not otherwise disrupted with a symbol(s) or button(s) when the light source is turned off. Rather, a symbol(s) is displayed on the first surface of the interior panel only when the light source is turned on and illuminated for selectively communicating information to the passenger(s) or other aircraft occupant(s). Further, in an exemplary embodiment, advantageously generating the command signal in response to changing the capacitance of the capacitive sensor by, for example, a finger allows for the control system to adjust ambient lighting/conditions, call a flight attendant, and/or the like. As such, in an exemplary embodiment, the interior panel provides hidden illuminable capacitive touch controls that allow for an aesthetically pleasing interior panel with the capability to adjust ambient conditions, call a flight attendant(s), and/or the like.

Figure 2:
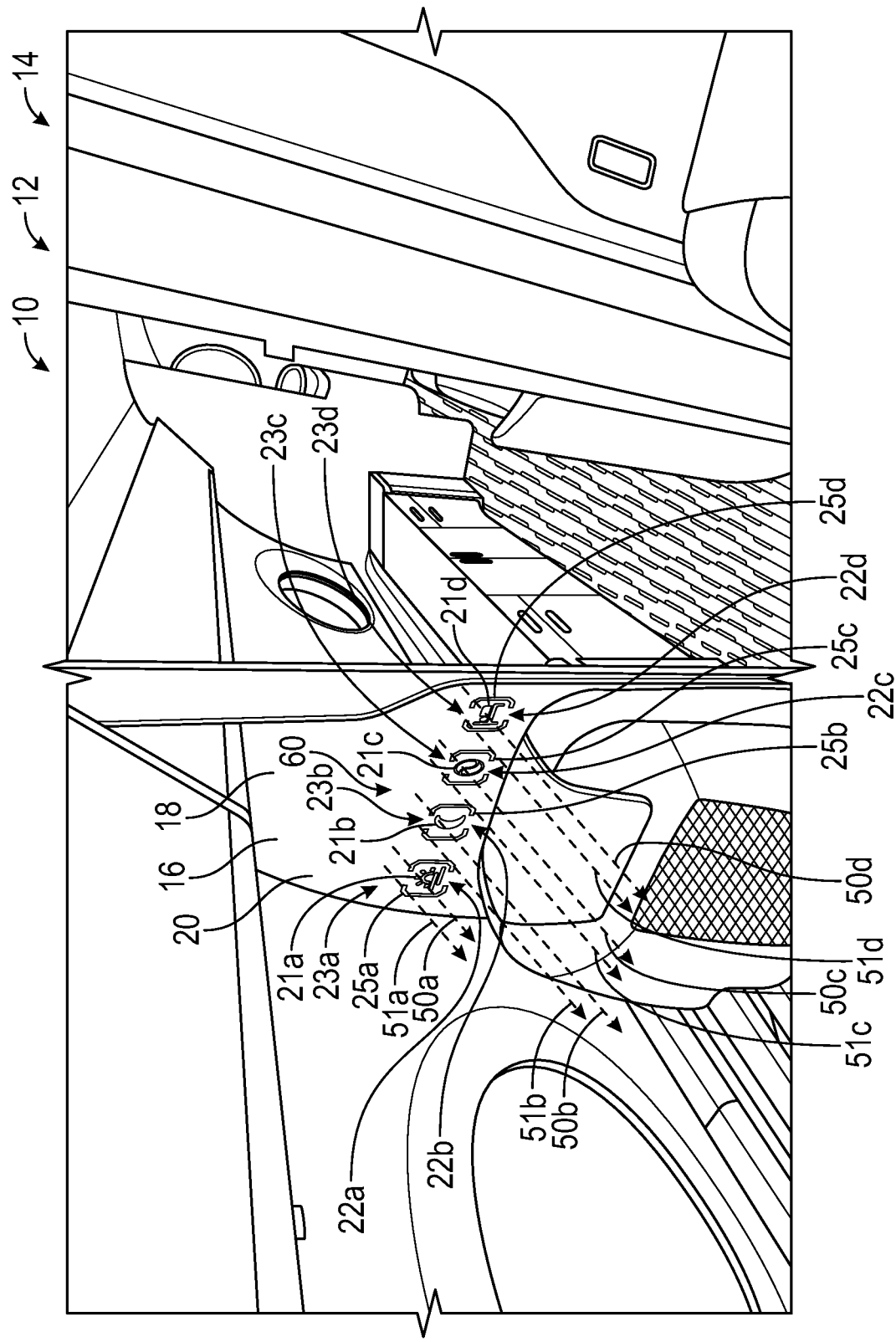
FIG. 2 illustrates a perspective view of a portion of an aircraft interior including an interior panel with illuminated patterns in accordance with an exemplary embodiment.

Referring to FIG. 1, an aircraft 10 including an aircraft structure 12 in accordance with an exemplary embodiment is provided. Although FIGS. 1-2 illustrate an aircraft, it is to be understood that various embodiments disclosed herein are applicable to vehicles other than just aircraft. The aircraft structure 12 is, for example, a fuselage that surrounds or otherwise has an interior 14 with an interior panel 16 disposed therein. Although the interior 14 of the aircraft 10 is illustrated as having the interior panel 16, it is understood that the interior 14 of the aircraft 10 may include any number of interior panels in addition to the interior panel 16.

The interior panel 16 includes an outer covering 18 that has an outer surface 20 that is exposed to the interior 14 of the aircraft 10. In an exemplary embodiment, the outer covering 18 includes or is made of wood, a plastic or polymeric material, a composite or laminated material, for example a wood-plastic composite or wood-plastic laminated construction, a decorated or aesthetically pleasing construction, and/or the like. In an exemplary embodiment, the outer covering 18 includes a veneer that includes the outer surface 20 and that is laminated to or otherwise overlaid on a backing material or substrate.

Referring also to FIG. 2, the interior panel 16 is operative to selectively and independently display illuminated patterns 22a-d on areas 23a-d, respectively. In an exemplary embodiment, each illuminated pattern 22a, 22b, 22c, or 22d includes an illuminated pattern inner portion 21a, 21b, 21c, or 21d and an illuminated pattern outer portion 25a, 25b, 25c, or 25d that surrounds at least a portion of the illuminated pattern inner portion 21a, 21b, 21c, or 21d, respectively. In an exemplary embodiment, the interior panel 16 is operative to selectively and independently display the illuminated pattern inner portions 21a-d and the illuminated pattern outer portions 25a-d on areas 23a-d, respectively. Although the interior panel 16 is illustrated as being operative to selectively and independently display illuminated patterns and/or portions of illuminated patterns that correspond to four patterns, various alternate embodiments of the interior panel 16 may include the interior panel 16 being operative to selectively and independently display illuminated patterns and/or portions of illuminated patterns that correspond to less than four patterns but at least one pattern, or to more than four patterns. When displayed, each of the illuminated pattern inner portions 21a-d and/or each of the illuminated pattern outer portions 25a-d are independently visible on the outer surface 20 of the outer covering 18 due to light rays 50a-d and 51a-d, respectively, as will be discussed in further detail below.

Referring also to FIG. 3, the outer covering 18 has a back surface 24 that is disposed opposite the outer surface 20 facing, for example, into an interior or inside of the interior panel 18. As such, the back surface 24 of the outer covering 18 is not exposed to the interior of the aircraft. The back surface 24 of the outer covering 18 includes patterns 26a-d that are formed in the back surface 24 and that correspond to the shapes of the illuminated patterns 22a-d, respectively, of the outer surface 20 of the outer covering 18. As used herein, the term "correspond" refers to articles or patterns having similar, substantially matching, or matching shapes, forms, alignment, and/or structures. In an exemplary embodiment, the patterns 26a-d are generally aligned with areas 23a-d. As used herein, the phrase "generally aligned" refers to articles and/or patterns that are arranged, oriented, and/or positioned relative to one another in a linear or substantially linear fashion. In an exemplary embodiment, each pattern 26a, 26b, 26c, or 26d includes a pattern inner portion 27a, 27b, 27c, or 27d and a pattern outer portion 29a, 29b, 29c, or 29d that surrounds at least a portion of the pattern inner portion 27a, 27b, 27c, or 27d, respectively. In an exemplary embodiment, the pattern inner portions 27a-d correspond to the shapes of the illuminated pattern inner portions 21a-d and the pattern outer portions 29a-d correspond to the shapes of the illuminated pattern outer portions 25a-d, respectively. In an exemplary embodiment, the patterns 26a-d are milled, cut, machined, etched, carved, engraved, or otherwise formed into the back surface 24 of the outer covering 18 so as to locally reduce the wall stock in the outer covering 18 without affecting or otherwise removing any material from the outer surface 20. In an exemplary embodiment, the outer covering 18 has a nominal wall stock of from about 1 to about 4 mm, for example about 1.5 mm, and a localized reduced wall stock of from about 0.2 to about 1 mm, such as about 0.25 to about 1 mm or about 0.2 to about 0.25 mm, such as about 0.25 mm that defines the patterns 26a-d. The patterns 26a-d are therefore hidden from or not visible on the outer surface 20 of outer covering 18.

Figure 5:
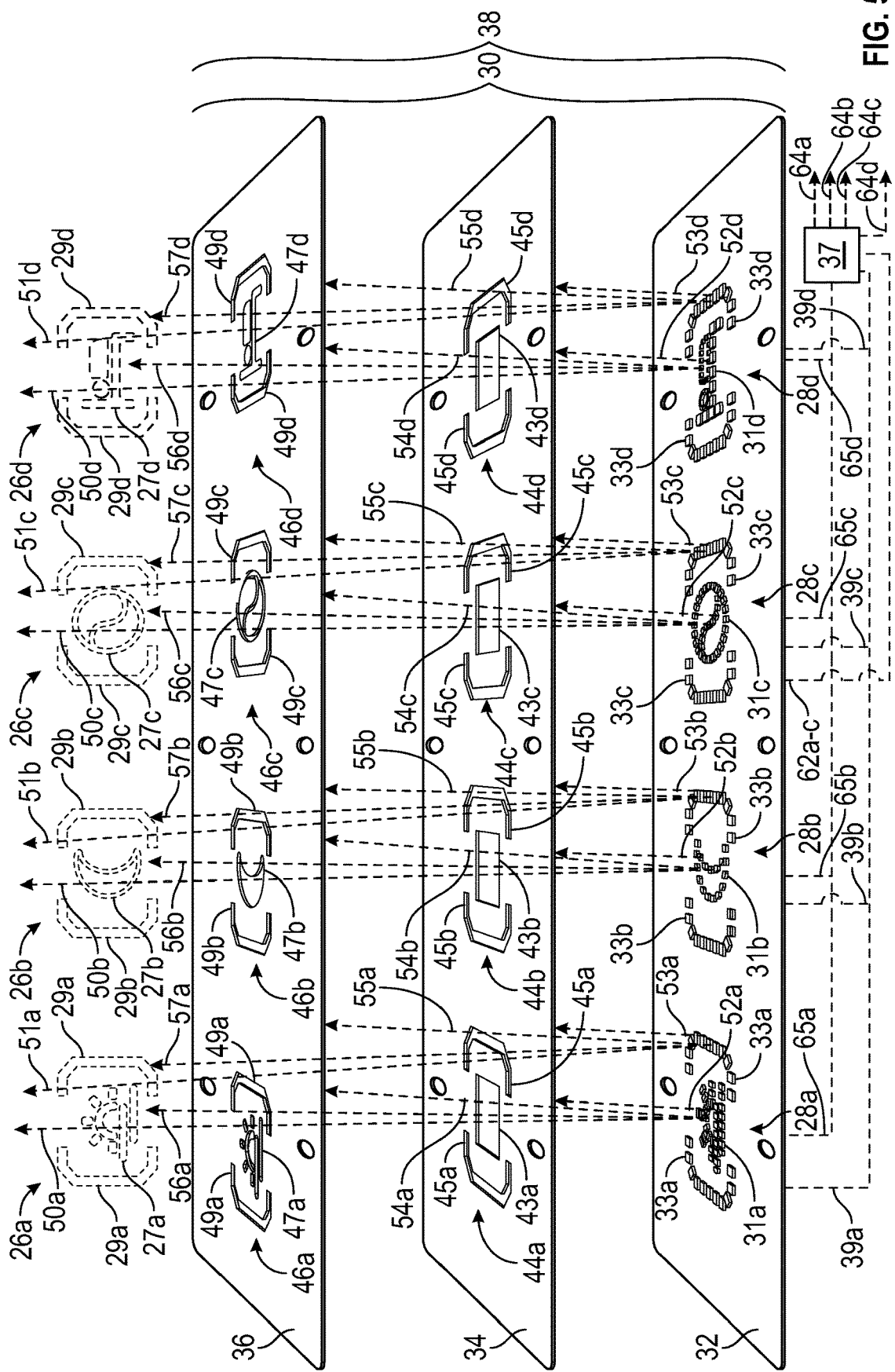
FIG. 5 illustrates an exploded perspective view of a board assembly that includes patterns and light sources that are in communication with the controller in accordance with an exemplary embodiment.
Figure 6:
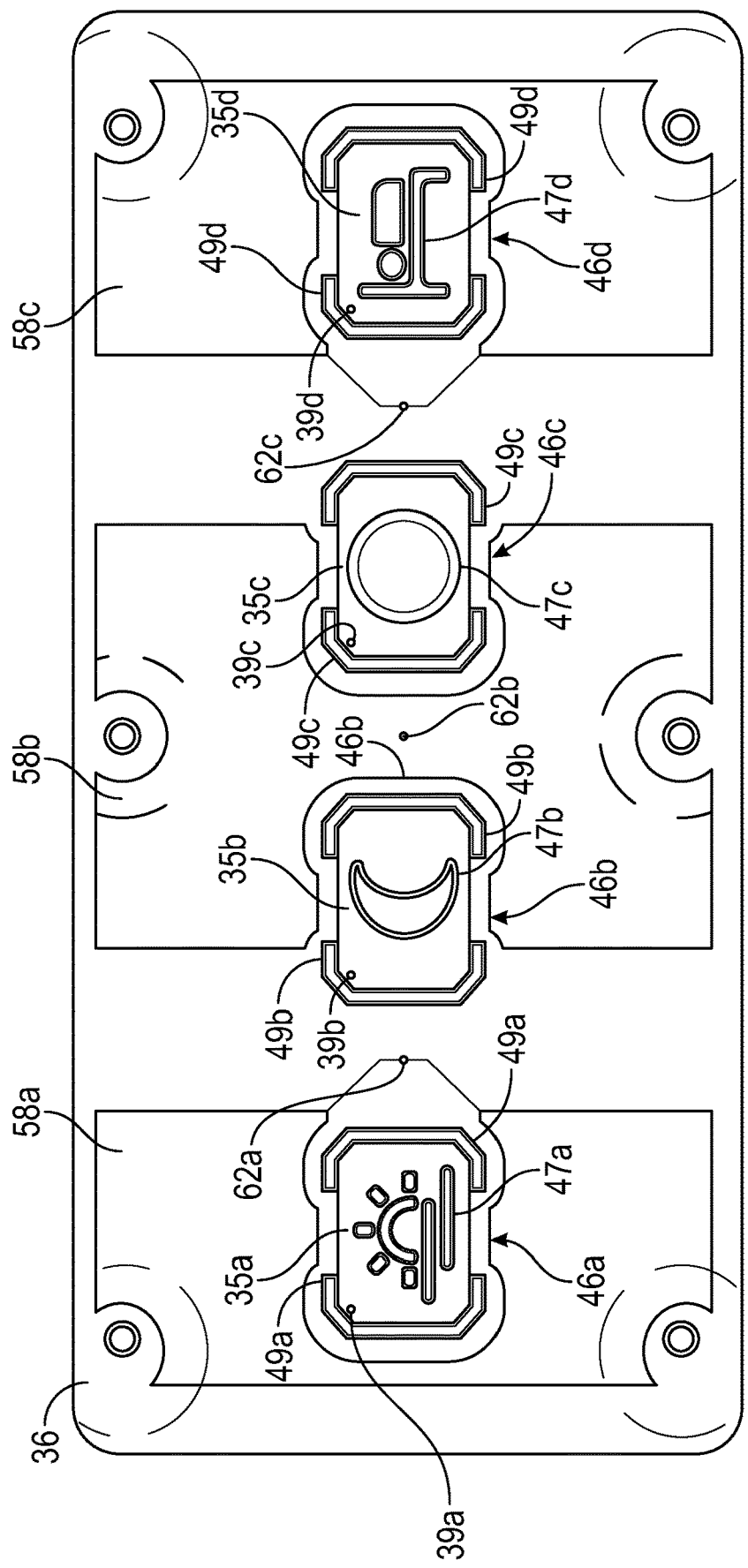
FIG. 6 illustrates a top view of a capacitive touch board that includes patterns and capacitive sensors that are in communication with a controller in accordance with exemplary embodiments.

Referring also to FIG. 5 and as will be discussed in further detail below, the interior panel 16 includes light sources 28a-d that are disposed in the interior of the interior panel 16 adjacent to the back surface 24 of the outer covering 20 generally aligned with the patterns 26a-d (illustrated as dashed line patterns without the outer covering 18 in FIG. 5), respectively. In an exemplary embodiment, each light source 28a, 28b, 28c, or 28d includes a light source inner portion 31a, 31b, 31c, or 31d and a light source outer portion 33a, 33b, 33c, or 33d that surrounds at least a portion of the light source inner portion 31a, 31b, 31c, or 31d, respectively. In an exemplary embodiment, the light source inner portions 31a-d are generally aligned with the pattern inner portions 27a-d and the light source outer portions 33a-d are generally aligned with the pattern outer portions 29a-d, respectively.

The light sources 28a-d are each selectively and independently operative to generate light. For example, each light source inner portion 31a, 31b, 31c, or 31d and each light source outer portion 33a, 33b, 33c, or 33d can independently be turned on to generate light regardless of whether the other light source inner portion(s) 31a, 31b, 31c, and/or 31d and/or the other light source outer portion(s) 33a, 33b, 33c, and/or 33d are turned off or turned on to generate light. This means that, for example, the light source inner portion 31a can be selectively and independently turned on to generate light while the other light source inner portions 31b-d and the light source outer portions 33a-d are turned off and do not generate light. In another example, the light source inner portions 31a-d and the light source outer portion 33a are all selectively and independently turned on to generate light while the light source outer portions 33b-d are turned off and do not generate light.

When the light source inner portion(s) 31a, 31b, 31c, and/or 31d generates light, the corresponding pattern inner portion(s) 27a, 27b, 27c, and/or 27d allows a portion(s) (indicated by light rays 50a, 50b, 50c, and/or 50d) of the light to pass through towards the outer surface 20 of the outer covering 18 while substantially obstructing another portion(s) (indicated by light rays 56a, 56b, 56c, and/or 56d) of the light generated by the light source inner portion(s) 31a, 31b, 31c, and/or 31d to make the corresponding illuminated pattern inner portion(s) 21a, 21b, 21c, and/or 21d visible on the outer surface 20. For example, the portion(s) 56a, 56b, 56c, and/or 56d of the light do not pass through the patterns 26a, 26b, 26c, and/or 26d while the portion(s) 50a, 50b, 50c, and/or 50d of the light pass through the pattern inner portion(s) 27a, 27b, 27c, and/or 27d so as to define the shape of the illuminated pattern inner portion(s) 21a, 21b, 21c, and/or 21d. As used herein, the phrase "substantially obstructing a portion of light" refers to blocking, preventing, and/or hindering the portion of light so that the portion of light is not noticeably visible and/or perceivable. In an exemplary embodiment, the locally reduce wall stock of the outer covering 18 that defines the pattern inner portion(s) 27a, 27b, 27c, and/or 27d allows the portion(s) 50a, 50b, 50c, and/or 50d of the light that is substantially aligned with the pattern inner portion(s) 27a, 27b, 27c, and/or 27d to pass through the locally reduce wall stock while the thicker or nominal wall stock of the outer covering 18 surrounding the borders of the pattern inner portion(s) 27a, 27b, 27c, and/or 27d substantially prevents or blocks the portion(s) 56a, 56b, 56c, and/or 56d of the light that illuminates outside of the borders of the pattern inner portion(s) 27a, 27b, 27c, and/or 27d from passing through the outer covering 18 to make the pattern inner portion(s) 27a, 27b, 27c, and/or 27d on the back surface 24 visibly read through to the outer surface 20 as the illuminated pattern inner portion(s) 21a, 21b, 21c, and/or 21d, respectively.

Likewise, when the light source outer portion(s) 33a, 33b, 33c, and/or 33d generates light, the corresponding pattern outer portion(s) 29a, 29b, 29c, and/or 29d allows a portion(s) (indicated by light rays 51a, 51b, 51c, and/or 51d) of the light to pass through towards the outer surface 20 of the outer covering 18 while substantially obstructing another portion(s) (indicated by light rays 57a, 57b, 57c, and/or 57d) of the light generated by the light source outer portion(s) 33a, 33b, 33c, and/or 33d to make the corresponding illuminated pattern outer portion(s) 25a, 25b, 25c, and/or 25d visible on the outer surface 20. For example, the portion(s)

57a, 57b, 57c, and/or 57d of the light do not pass through the patterns 26a, 26b, 26c, and/or 26d while the portion(s) 51a, 51b, 51c, and/or 51d of the light pass through the pattern outer portion(s) 29a, 29b, 29c, and/or 29d so as to define the shape of the illuminated pattern outer portion(s) 25a, 25b, 25c, and/or 25d. In an exemplary embodiment, the locally reduce wall stock of the outer covering 18 that defines the pattern outer portion(s) 29a, 29b, 29c, and/or 29d allows the portion(s) 51a, 51b, 51c, and/or 51d of the light that is substantially aligned with the pattern outer portion(s) 29a, 29b, 29c, and/or 29d to pass through the locally reduce wall stock while the thicker or nominal wall stock of the outer covering 18 surrounding the borders of the pattern outer portion(s) 29a, 29b, 29c, and/or 29d substantially prevents or blocks the portion(s) 57a, 57b, 57c, and/or 57d of the light that illuminates outside of the borders of the pattern outer portion(s) 29a, 29b, 29c, and/or 29d from passing through the outer covering 18 to make the pattern outer portion(s) 29a, 29b, 29c, and/or 29d on the back surface 24 visibly read through to the outer surface 20 as the illuminated pattern outer portion(s) 25a, 25b, 25c, and/or 25d, respectively.

Referring to FIGS. 1-6, in an exemplary embodiment, the interior panel 16 includes a board assembly 30. The board assembly 30 is disposed in the interior of the interior panel 16 adjacent to the back surface 24 of the outer covering 18. In an exemplary embodiment, the board assembly 30 includes a capacitive touch board 36, a masking board 34, and a lighting board 32 that includes the light sources 28a-d as discussed above. In an exemplary embodiment, the capacitive touch board 36, the masking board 34, and the lighting board 32 are stacked on top of each other to form a stacked board assembly 38. As illustrated and in accordance with an exemplary embodiment, the stacked board assembly 38 is held together by a fastener(s) 40 or the like, and the back surface 24 of the outer covering 18 includes corresponding relief holes 42 for accommodating any protruding portion(s) of the fastener(s) 40.

As illustrated, the board assembly 30 includes the capacitive touch board 36 that is disposed between the masking board 34 and the back surface 24 of the outer covering 18. The capacitive touch board 36 includes capacitive sensors 35a-d that are disposed in the interior of the interior panel 16 adjacent to the back surface 24 of the outer covering 18 generally aligned with the patterns 26a-d (illustrated as dashed line patterns without the outer covering 18 in FIG. 5), respectively. Although the capacitive sensors 35a-d are illustrated as forming part of the capacitive touch board 36, various alternate embodiments of the interior panel 16 include the capacitive sensors 35a-d disposed in the interior panel 16 without an arrangement of the capacitive touch board 36. The capacitive sensors 35a, 35b, 35c, or 35d are each selectively and independently configured to generate a capacitance change signal (via communication line(s) 39a, 39b, 39c, or 39d) in response to a change in capacitance of the capacitive sensor 35a, 35b, 35c, or 35d, respectively. In an exemplary embodiment, a change in capacitance of the capacitive sensor(s) 35a, 35b, 35c, and/or 35d results from an object 19 being proximate to the area(s) 23a, 23b, 23c, and/or 23d, respectively, of the outer surface 20. For example, the object 19 the object does not need to touch the area(s) 23a, 23b, 23c, and/or 23d and further, a gesture or mere motion executed near the area(s) 23a, 23b, 23c, and/or 23d can result in a change in capacitance of the corresponding capacitive sensor(s) 35a, 35b, 35c, or 35d, respectively. In an exemplary embodiment, the object 19 is a finger or other portion(s) of a hand, a glove or mitten with conductive threads, or the like.

With continuing reference to FIGS. 1-6, as illustrated and in accordance with an exemplary embodiment, the capacitive touch board 36 includes refining patterns 46a-d that are formed through the capacitive touch board 36 and that generally align with the corresponding patterns 26a-d. In an exemplary embodiment, each refining pattern 46a, 46b, 46c, or 46d includes a refining pattern inner portion 47a, 47b, 47c, or 47d and a refining pattern outer portion 49a, 49b, 49c, or 49d that surrounds at least a portion of the refining pattern inner portion 47a, 47b, 47c, or 47d, respectively. In an exemplary embodiment, the refining pattern inner portions 47a-d are generally aligned with the pattern inner portions 27a-d and the refining pattern outer portions 49a-d are generally aligned with the pattern outer portions 29a-d, respectively. In an exemplary embodiment, the capacitive sensors 35a-d are each at least partially surrounded by the refining patterns 46a-d, respectively. In an exemplary embodiment, the capacitive sensors 35a-d are each disposed within a border(s) defined by the refining pattern outer portions 49a-d. In an exemplary embodiment, the capacitive touch board 36 is a PCB.

When the light source inner portion(s) 31a, 31b, 31c, and/or 31d generates light, the refining pattern inner portion(s) 47a, 47b, 47c, and/or 47d allows the portion(s) 50a, 50b, 50c, and/or 50d of the light to pass through towards the corresponding pattern inner portion(s) 27a, 27b, 27c, and/or 27d while substantially obstructing another portion(s) (indicated by rays 54a, 54b, 54c, and/or 54d) of the light generated by the light source inner portion(s) 31a, 31b, 31c, and/or 31d to further enhance visibility and/or clarity of the corresponding illuminated pattern inner portion(s) 21a, 21b, 21c, and/or 21d on the outer surface 20. For example, the portion(s) 54a, 54b, 54c, and/or 54d of the light do not pass through the refining patterns 46a, 46b, 46c, and/or 46d while the portion(s) 50a, 50b, 50c, and/or 50d of the light pass through the refining pattern inner portion(s) 47a, 47b, 47c, and/or 47d to refine the light that encounters the pattern inner portion(s) 27a, 27b, 27c, and/or 27d to define the shape of the illuminated pattern inner portion(s) 21a, 21b, 21c, and/or 21d.

Likewise, when the light source outer portion(s) 33a, 33b, 33c, and/or 33d generates light, the refining pattern outer portion(s) 49a, 49b, 49c, and/or 49d allows the portion(s) 51a, 51b, 51c, and/or 51d of the light to pass through towards the corresponding pattern outer portion(s) 29a, 29b, 29c, and/or 29d while substantially obstructing another portion(s) (indicated by rays 55a, 55b, 55c, and/or 55d) of the light generated by the light source outer portion(s) 33a, 33b, 33c, and/or 33d to further enhance visibility and/or clarity of the corresponding illuminated pattern outer portion(s) 25a, 25b, 25c, and/or 25d on the outer surface 20. For example, the portion(s) 55a, 55b, 55c, and/or 55d of the light do not pass through the refining patterns 46a, 46b, 46c, and/or 46d while the portion(s) 51a, 51b, 51c, and/or 51d of the light pass through the refining pattern outer portion(s) 49a, 49b, 49c, and/or 49d to refine the light that encounters the pattern outer portion(s) 29a, 29b, 29c, and/or 29d to define the shape of the illuminated pattern outer portion(s) 25a, 25b, 25c, and/or 25d.

As illustrated and in accordance with an exemplary embodiment, the capacitive touch board 36 includes additional capacitive sensors configured as capacitive touch pads 58a, 58b, and 58c that each surround at least a portion of one of the refining patterns 46a, 46b, 46c, or 46d. Although the capacitive touch board 36 is illustrated as having seven capacitive touch pads, various alternate embodiments of the capacitive touch board 36 include the capacitive touch board 36 having less than seven capacitive touch pads but at least one capacitive touch pad, or as having more than seven capacitive touch pads. In an exemplary embodiment, the capacitive touch pads 58a, 58b, and 58c each surround at least a portion of one of the refining pattern outer portions 49a, 49b, 49c, or 49d. The capacitive touch pads 58a-c are generally aligned with an area 60 of the outer surface 20 of the interior panel 16 that is adjacent to the areas 23a-d. The capacitive touch pads 58a, 58b, and 58c are configured to generate capacitance change signals via communication lines 62a, 62b, and 62c in response to a change in capacitance of the capacitive touch pads 58a, 58b, and 58c, respectively. In an exemplary embodiment, a change in capacitance of the capacitive touch pads 58a, 58b, and/or 58c results from an object 19 being proximate to the area 60 of the outer surface 20. In an exemplary embodiment, the object 19 is a finger or other portion(s) of a hand, a glove or mitten with conductive threads, or the like. In an exemplary embodiment, the capacitive touch pads 58a, 58b, and/or 58c are configured to generate the capacitive change signal(s) 62a, 62b, and/or 62c when the object 19 is moving proximate to the area 60.

As illustrated, the board assembly 30 includes the masking board 34 that is disposed between the lighting board 32 and the capacitive touch board 36 behind the back surface 24 of the outer covering 18. The masking board 34 includes masking patterns 44a-d that are formed through the masking board 34 and that generally align with the light sources 28a-d and the corresponding patterns 26a-d, respectively. In an exemplary embodiment, the masking patterns 44a-d include masking pattern inner portions 43a-d that are generally aligned with the pattern inner portions 27a-d and masking pattern outer portions 45a-d that are generally aligned with the pattern outer portions 29a-d and that surround at least a portion of the masking pattern inner portions 43a-d, respectively.

When the light source inner portion(s) 31a, 31b, 31c, and/or 31d is turned on and generates light, the masking pattern inner portion(s) 43a, 43b, 43c, and/or 43d allows the portion(s) 50a, 50b, 50c, and/or 50d of the light to pass through towards the corresponding pattern inner portion(s) 27a, 27b, 27c, and/or 27d while substantially obstructing another portion(s) (indicated by rays 52a, 52b, 52c, and/or 52d) of the light generated by the light source inner portion(s) 31a, 31b, 31c, and/or 31d to enhance visibility and/or clarity of the corresponding illuminated pattern inner portion(s) 21a, 21b, 21c, and/or 21d on the outer surface 20. For example, the portion(s) 52a, 52b, 52c, and/or 52d of the light do not pass through the masking patterns 44a, 44b, 44c, and/or 44d while the portion(s) 50a, 50b, 50c, and/or 50d of the light pass through the masking pattern inner portion(s) 43a, 43b, 43c, and/or 43d to refine or otherwise reduce scatter of the light that encounters the pattern inner portion(s) 27a, 27b, 27c, and/or 27d to define the shape of the illuminated pattern inner portion(s) 21a, 21b, 21c, and/or 21d.

Likewise, when the light source outer portion(s) 33a, 33b, 33c, and/or 33d is turned on and generates light, the masking pattern outer portion(s) 45a, 45b, 45c, and/or 45d allows the portion(s) 51a, 51b, 51c, and/or 51d of the light to pass through towards the corresponding pattern outer portion(s) 29a, 29b, 29c, and/or 29d while substantially obstructing another portion(s) (indicated by rays 53a, 53b, 53c, and/or 53d) of the light generated by the light source outer portion(s) 33a, 33b, 33c, and/or 33d to enhance visibility and/or clarity of the corresponding illuminated pattern outer portion(s) 25a, 25b, 25c, and/or 25d on the outer surface 20. For example, the portion(s) 53a, 53b, 53c, and/or 53d of the light do not pass through the masking patterns 44a, 44b, 44c, and/or 44d while the portion(s) 51a, 51b, 51c, and/or 51d of the light do pass through the masking pattern outer portion(s) 45a, 45b, 45c, and/or 45d to refine or otherwise reduce scatter of the light that encounters the pattern outer portion(s) 29a, 29b, 29c, and/or 29d to define the shape of the illuminated pattern outer portion(s) 25a, 25b, 25c, and/or 25d. In an exemplary embodiment, the masking board 34 is a PCB.

In an exemplary embodiment, the light sources 28a-d as discussed above are mounted on the lighting board 32. In an exemplary embodiment, the light sources 28a-d each include a plurality of light-emitting diodes (LEDs) that are mounted on the lighting board 32 and are arranged in light-emitting patterns 43a-d that substantially correspond to the patterns 26a-d of the back surface 24 of the outer covering 18. In an exemplary embodiment, the lighting board 32 is a printed circuit board (PCB).

In an exemplary embodiment, the lighting board 32 includes a controller 37 that is mounted to the lighting board 32. In an exemplary embodiment, the controller includes one or more processors, controllers, and/or microcontrollers of known to those skilled in the art. Although the controller 37 is illustrated as being mounted to the lighting board 32, various alternate embodiments of the interior panel 16 include the controller 37 disposed in the interior panel 16 and not forming any part of the lighting board 32. In an exemplary embodiment, the controller 37 is disposed in the interior of the interior panel 16 adjacent to the back surface 24 of the outer covering 18. The controller 37 is in communication with the capacitive sensors 35a-d and the capacitive sensor pads 58a-c to receive the capacitance change signals 39a-d and the capacitance change signals 62a-c, respectively. The controller 37 is also in communication with the light sources 28a-d to direct the light sources 28a-d to independently and selectively generate light via communication lines 65a-d, respectively. In an exemplary embodiment, the controller 37 is configured to independently and selectively direct the light source inner portions 31a-d and the light source outer portions 33a-d to generate light in response to the capacitance change signals 39a-d, respectively. This means, for example, that the controller 37 is configured to independently and selectively direct the light source inner portion 31a and/or the light source outer portion 33a to generate light in response to the capacitance change signal 39a. In an exemplary embodiment, the controller 37 is configured to independently and selectively direct the light source inner portions 31a-d and the light source outer portions 33a-d to generate light in response to the capacitance change signal(s) 62a, 62b, and/or 62c for a duration of time. This means, for example, that the controller 37 is configured to independently and selectively direct the light source inner portions 31a, 31b, 31c, and/or 31d and/or the light source outer portions 33a, 33b, 33c, and/or 33d to generate light in response to the capacitance change signal(s) 62a, 62b, and/or 62c for a duration of time. The duration of time is, for example, less than about 1 minute, such as about 10 seconds, for example, about 5 seconds.

In an exemplary embodiment, the controller 37 is operative to generate command signals via communication lines 64a-d that correspond to the illuminated pattern(s) 22a, 22b, 22c, and/or 22d in response to the capacitance change signals 39a-d, respectively. The command signals 64a-d are, for example, signals that directly or indirectly adjust ambient lighting, adjust ambient temperature, calls a flight attendant, places an order for food, or the like. In an exemplary embodiment, each command signal 64a, 64b, 64c, or 64d performs a different function. This means, for example, that the command signal 64a adjusts ambient lighting, command signal 64b adjusts ambient temperature, command signal 64c calls a flight attendant, and command signal 64d places an order for food.

Figure 7:
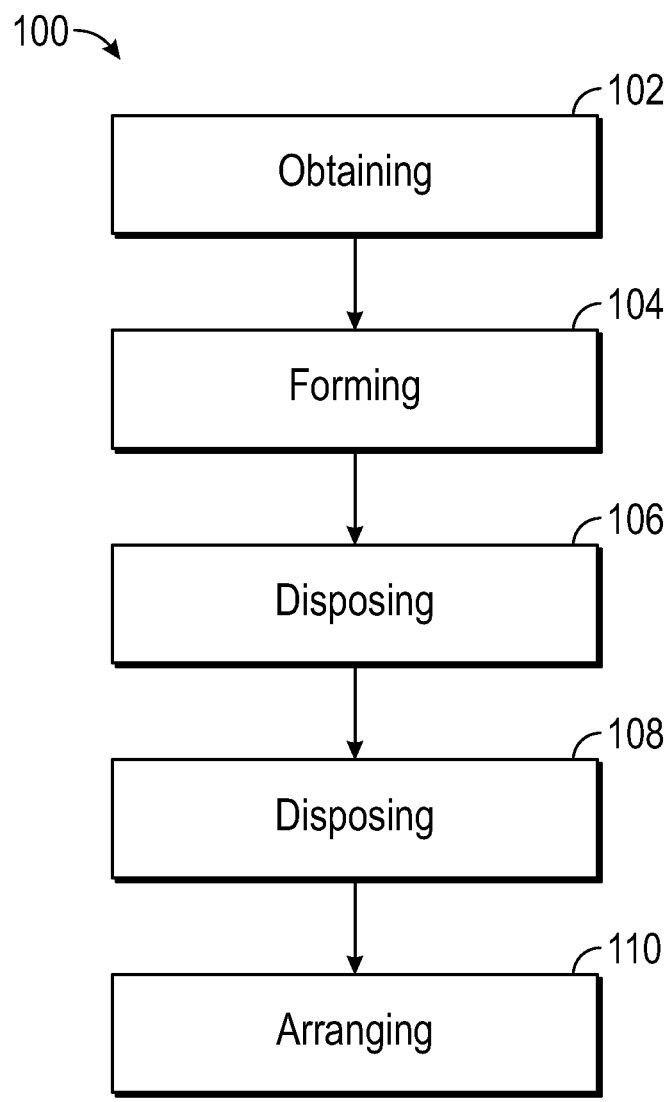
FIG. 7 illustrates a flow diagram for a method for making an interior panel for an interior of a vehicle in accordance with an exemplary embodiment.

Referring to FIG. 7, a method 100 for making an interior panel for an interior of a vehicle in accordance with an exemplary embodiment is provided. The method 100 includes obtaining (STEP 102) an outer covering. For example, the outer covering may be obtained by forming the outer covering, procuring the outer covering, and/or locating the outer covering. The outer covering has a first surface that is configured to be exposed to the interior of the vehicle and a second surface that is disposed opposite the first surface.

A pattern is formed (STEP 104) in the second surface and is hidden from the first surface. A light source is disposed (STEP 106) adjacent to the second surface and is generally aligned with the first pattern. The light source is operative to generate light. When the light source generates light, an illuminated pattern corresponding to the pattern formed in the second surface is visible on an area of the first surface.

A capacitive sensor is disposed (STEP 108) proximate to the second surface. The capacitive sensor is configured to generate a capacitance change signal in response to change in capacitance of the capacitive sensor when an object is proximate to the area of the first surface.

A controller is arranged (STEP 108) in communication with the capacitive sensor to receive the capacitance change signal. The controller is configured to generate a command signal in response to the capacitance change signal.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. An interior panel for an interior of a vehicle, the interior panel comprising:

an outer covering having a first surface that is configured to be exposed to the interior of the vehicle and a second surface that is disposed opposite the first surface, wherein the second surface has a first pattern formed therein that is hidden from the first surface;

a first light source that is configured to generate light and that is disposed adjacent to the second surface aligned with the first pattern, wherein when the first light source generates light, a first illuminated pattern corresponding to the first pattern formed in the second surface is visible on a first area of the first surface;

a first capacitive sensor that is disposed proximate to the second surface and that is configured to generate a first capacitance change signal in response to a change in capacitance of the first capacitive sensor when an object is proximate to the first area of the first surface; and a controller in communication with the first capacitive sensor to receive the first capacitance change signal and configured to generate a first command signal in response to the first capacitance change signal, wherein the first area is aligned with the first pattern, wherein the first capacitive sensor is aligned with the first pattern, and wherein the controller is in communication with the first light source and is configured to direct the first light source to generate light in response to the first capacitance change signal, wherein the interior panel includes a board assembly that is disposed adjacent to the second surface and that includes a capacitive touch board, and wherein the capacitive touch board includes the first capacitive sensor, and wherein the capacitive touch board includes a first refining pattern formed therethrough that is aligned with the first pattern, and wherein the first capacitive sensor is at least partially surrounded by the first refining pattern.

2. The interior panel of claim 1, wherein the first pattern includes a first pattern inner portion and a first pattern outer portion that surrounds at least a portion of the first pattern inner portion, wherein the first light source includes a first light source inner portion that is aligned with the first pattern inner portion and a first light source outer portion that surrounds at least a portion of the first light source inner portion and that is aligned with the first pattern outer portion, and wherein the first refining pattern includes a first refining pattern inner portion that is aligned with the first pattern inner portion and a first refining pattern outer portion that surrounds at least a portion of the first refining pattern inner portion and that is aligned with the first pattern outer portion.

3. The interior panel of claim 2, wherein the first light source inner portion and the first light source outer portion are configured to independently generate light, wherein the first illuminated pattern includes a first illuminated pattern inner portion that corresponds to the first pattern inner portion and a first illuminated pattern outer portion that corresponds to the first pattern outer portion, wherein when the first light source inner portion generates light, the first refining pattern inner portion allows a first portion of light to pass therethrough while obstructing a second portion of light to produce the first illuminated pattern inner portion on the first surface, and wherein when the first light source outer portion generates light, the first refining pattern outer portion allows a third portion of light to pass therethrough while obstructing a fourth portion of light to produce the first illuminated pattern outer portion on the first surface.

4. The interior panel of claim 3, wherein the capacitive touch board includes a second capacitive sensor that surrounds at least a portion the first refining pattern, wherein the first surface has a second area that is adjacent to the first area and the second capacitive sensor is aligned with the second area of the first surface, wherein the second capacitive sensor is configured to generate a second capacitance change signal in response to change in capacitance of the second capacitive sensor when the object is proximate to the second area of the first surface, wherein the controller is in communication with the second capacitive sensor to receive the second capacitance change signal, and wherein the controller is configured to direct the first light source inner portion to generate light for a first duration of time in response to the second capacitance change signal to produce the first illuminated pattern inner portion on the first surface for the first duration of time.

5. The interior panel of claim 4, wherein the second capacitive sensor is configured to generate the second capacitance change signal when the object is moving proximate to the second area of the first surface.

6. The interior panel of claim 5, wherein when the first capacitive sensor generates the first capacitance change signal during the first duration of time, the controller is configured to direct the first light source inner portion and the first light source outer portion to generate light for a second duration of time in response to the first capacitance change signal to produce the first illuminated pattern inner portion and the first illuminated pattern outer portion on the first surface for the second duration of time.

7. The interior panel of claim 6, wherein the second surface has a second pattern formed therein that is disposed adjacent to the first pattern and that is hidden from the first surface, and wherein the interior panel further includes:
a second light source that is configured to generate light and that is disposed adjacent to the second surface aligned with the second pattern, wherein when the second light source generates light, a second illuminated pattern corresponding to the second pattern formed in the second surface is visible on a second area of the first surface, wherein the second area of the first surface is aligned with the second pattern; and
a third capacitive sensor disposed on the capacitive touch board adjacent to the first capacitive sensor aligned with the second pattern, wherein the third capacitive sensor is configured to generate a third capacitance change signal in response to change in capacitance of the third capacitive sensor when the object is proximate to the third area of the first surface, and wherein the controller is in communication with the second light source and is configured to direct the second light source to generate light in response to the third capacitance change signal.

8. The interior panel of claim 7, wherein the capacitive touch board includes a second refining pattern formed therethrough that is aligned with the second pattern, and wherein the third capacitive sensor is at least partially surrounded by the second refining pattern.

9. The interior panel of claim 8, wherein the second pattern includes a second pattern inner portion and a second pattern outer portion that surrounds at least a portion of the second pattern inner portion, wherein the second light source includes a second light source inner portion that is aligned with the second pattern inner portion and a second light source outer portion that surrounds at least a portion of the second light source outer portion and that is aligned with the second pattern outer portion, and wherein the second refining pattern includes a second refining pattern inner portion that is aligned with the second pattern inner portion and a second refining pattern outer portion that surrounds at least a portion of the second refining pattern inner portion and that is aligned with the second pattern outer portion.

10. The interior panel of claim 9, wherein the second light source inner portion and the second light source outer portion are configured to independently generate light, wherein the second illuminated pattern includes a second illuminated pattern inner portion that corresponds to the second pattern inner portion and a second illuminated pattern outer portion that corresponds to the second pattern outer portion, wherein when the second light source inner portion generates light, the second refining pattern inner portion allows a fifth portion of light to pass therethrough while obstructing a sixth portion of light to produce the second illuminated pattern inner portion on the first surface, and wherein when the second light source outer portion generates light, the second refining pattern outer portion allows a seventh portion of light to pass therethrough while obstructing an eighth portion of light to produce the second illuminated pattern outer portion on the first surface.

11. The interior panel of claim 10, wherein the second capacitive sensor surrounds at least portions of the first refining pattern and the second refining pattern, and wherein the controller is configured to direct the first light source inner portion and the second light source inner portion to generate light for the duration of time in response to the second capacitance change signal.

12. The interior panel of claim 11, wherein when the third capacitive sensor generates the third capacitance change signal during the first duration of time, the controller is configured to direct the second light source inner portion and the second light source outer portion to generate light for the second duration of time in response to the third capacitance change signal to produce the second illuminated pattern inner portion and the second illuminated pattern outer portion on the first surface for the second duration of time.

13. The interior panel of claim 12, wherein the board assembly includes a lighting board that is disposed adjacent to the capacitive touch board, and wherein the first light source and the second light source are mounted on the lighting board.

14. The interior panel of claim 13, wherein the board assembly includes a masking board that is disposed between the lighting board and the capacitive touch board, wherein the masking board includes a first masking pattern formed therethrough that is aligned with the first pattern and a second masking pattern formed therethrough that is aligned with the second pattern, wherein the first masking pattern includes a first masking pattern inner portion that is aligned with the first pattern inner portion and a first masking pattern outer portion that surrounds at least a portion of the first masking pattern inner portion and that is aligned with the first pattern outer portion, wherein the second masking pattern includes a second masking pattern inner portion that is aligned with the second pattern inner portion and a second masking pattern outer portion that surrounds at least a portion of the second masking pattern inner portion and that is aligned with the second masking pattern outer portion, wherein when the first light source inner portion generates light, the first masking pattern inner portion allows the first and second portions of light to pass therethrough towards the first refining pattern inner portion while obstructing a first remaining portion of light, wherein when the first light source outer portion generates light, the first masking pattern outer portion allows the third and fourth portions of light to pass therethrough towards the first refining pattern outer portion while obstructing a second remaining portion of light, wherein when the second light source inner portion generates light, the second masking pattern inner portion allows the fifth and sixth portions of light to pass therethrough towards the second refining pattern inner portion while obstructing a third remaining portion of light, and wherein when the second light source outer portion generates light, the second masking pattern outer portion allows the seventh and eighth portions of light to pass therethrough towards the second refining pattern outer portion while obstructing a fourth remaining portion of light.

15. A vehicle comprising:
a vehicle structure having an interior; and
an interior panel disposed in the interior of the vehicle structure, the interior panel comprising:
an outer covering having a first surface that is exposed to the interior of the vehicle and a second surface that is disposed opposite the first surface, wherein the second surface has a pattern formed therein that is hidden from the first surface;

a light source that is configured to generate light and that is disposed adjacent to the second surface aligned with the pattern, wherein when the light source generates light, an illuminated pattern corresponding to the pattern formed in the second surface is visible on an area of the first surface;

a capacitive sensor that is disposed proximate to the second surface and that is configured to generate a capacitance change signal in response to change in capacitance of the capacitive sensor when an object is proximate to the area of the first surface; and a controller in communication with the capacitive sensor to receive the capacitance change signal and configured to generate a command signal in response to the capacitance change signal, wherein the area is aligned with the pattern, wherein the capacitive sensor is aligned with the pattern, and wherein the controller is in communication with the light source and is configured to direct the light source to generate light in response to the capacitance change signal, wherein the interior panel includes a board assembly that is disposed adjacent to the second surface and that includes a capacitive touch board, and wherein the capacitive touch board includes the capacitive sensor, and wherein the capacitive touch board includes a refining pattern formed therethrough that is aligned with the pattern, and wherein the capacitive sensor is at least partially surrounded by the refining pattern.

16. The vehicle of claim 15, wherein the vehicle includes a control system that is in communication with the controller to receive the command signal and that is configured to generate at least one control signal in response to the command signal to direct at least one device of the vehicle to respond to the command.

17. A method for making an interior panel for an interior of a vehicle, the method comprising the steps of:

obtaining an outer covering that has a first surface that is configured to be exposed to the interior of the vehicle and a second surface that is disposed opposite the first surface;

forming a pattern in the second surface that is hidden from the first surface;

disposing a light source adjacent to the second surface aligned with the pattern, wherein the light source is operative to generate light, and wherein when the light source generates light, an illuminated pattern corresponding to the pattern formed in the second surface is visible on an area of the first surface;

disposing a capacitive sensor proximate to the second surface, wherein the capacitive sensor is configured to generate a capacitance change signal in response to a change in capacitance of the capacitive sensor when an object is proximate to the area of the first surface; and arranging a controller in communication with the capacitive sensor to receive the capacitance change signal, wherein the controller is configured to generate a command signal in response to the capacitance change signal, wherein the area is aligned with the pattern, wherein the capacitive sensor is aligned with the pattern, and wherein the controller is in communication with the light source and is configured to direct the light source to generate light in response to the capacitance change signal, wherein the interior panel includes a board assembly that is disposed adjacent to the second surface and that includes a capacitive touch board, and wherein the capacitive touch board includes the capacitive sensor, and wherein the capacitive touch board includes a refining pattern formed therethrough that is aligned with the pattern, and wherein the capacitive sensor is at least partially surrounded by the refining pattern.

* * * * *